United States Patent [19]

Schwartzkopf

[11] Patent Number: 5,053,384

[45] Date of Patent: * Oct. 1, 1991

[54] METHOD OF PRODUCING SUPERCONDUCTING FIBERS OF BISMUTH STRONTIUM CALCIUM COPPER OXIDE (BI(2212) AND BI(2223))

[75] Inventor: Louis A. Schwartzkopf, Mankato, Minn.

[73] Assignee: Iowa State University Research Foundation, Inc., Ames, Iowa

[*] Notice: The portion of the term of this patent subsequent to Nov. 13, 2007 has been disclaimed.

[21] Appl. No.: 492,932

[22] Filed: Mar. 12, 1990

Related U.S. Application Data

[63] Continuation-in-part of Ser. No. 383,872, Jul. 21, 1989, Pat. No. 4,970,194.

[51] Int. Cl.$^5$ ............. F04B 41/88; H01B 12/04
[52] U.S. Cl. .................................. 505/1; 29/599; 148/404; 428/930; 505/704; 505/733
[58] Field of Search .................. 505/1, 704, 733; 148/404; 428/930; 29/599

[56] References Cited

U.S. PATENT DOCUMENTS 4,937,225  6/1990  Kalonji et al. ............... 505/1

FOREIGN PATENT DOCUMENTS

| 0244527 | 10/1988 | Japan | 505/733 |
| 0318025 | 12/1988 | Japan | 505/733 |
| 0014817 | 1/1989 | Japan | 505/733 |
| 0041120 | 2/1989 | Japan | 505/733 |

OTHER PUBLICATIONS

Takahashi et al., Jap. Jour. Appl. Phys. (Jul. '87), L-1991.
Yoshimura et al., Jap. Jour. Appl. Phys., 27 (Oct. 1988), L-1877.
Komatsu et al., Jap. Jour. Appl. Phys., 27 (Oct. 1988), L-1839.
Moon et al., Appl. Phys. Lett., 55 (Oct. 1989), 1466.

Primary Examiner—Upendra Roy
Attorney, Agent, or Firm—Zarley, McKee, Thomte, Voorhees & Sease

[57] ABSTRACT

Fibers of Bi(2212) have been produce by pendant drop melt extraction. This technique involves the end of a rod of Bi(2212) melted with a hydrogen-oxygen torch, followed by lowering onto the edge of a spinning wheel. The fibers are up to 15 cm in length with the usual lateral dimensions, ranging from 20 um to 30 um. The fibers require a heat treatment to make them superconducting.

6 Claims, No Drawings

METHOD OF PRODUCING SUPERCONDUCTING FIBERS OF BISMUTH STRONTIUM CALCIUM COPPER OXIDE (BI(2212) AND BI(2223))

GRANT REFERENCE

This invention was made with Government support under Contract No. W-7405-ENG82 awarded by the Department of Energy. The Government has certain rights in the invention.

CROSS REFERENCE TO A RELATED APPLICATION

This application is a continuation-in-part of co-pending application Ser. No. 383,872, filed July 21, 1989.

BACKGROUND OF THE INVENTION

This invention relates to superconductive metal oxide ceramics, in particular to $Bi_2Sr_2CaCu_2O_8$ (Bi(2212)) and $Bi_2Sr_2Ca_2Cu_2O_3$ (Bi(2223)), and may be applicable to lead doped Bi(2212) and Bi(2213).

The technology of superconductivity, particularly metal oxide ceramics which conduct electricity with no resistance at temperatures above the boiling point of liquid nitrogen, unlike previously known materials that can superconduct only near absolute zero, has been rapidly developing. These materials, i.e. certain metal oxide ceramics, can conduct electricity with no resistance at temperatures above the boiling point of liquid nitrogen (77K or $-196°$ C.). The discovery of these materials has been quite recent and the demand for practical application of these materials will be ever increasing in the future. In particular, it is desirable to develop these new metal oxide ceramics, particularly Bi(2212) and Bi(2223) and lead doped varients thereof into useful conductor shapes such as wires, films, or thin sheets.

An enormous amount of effort is being devoted to exploring ways of making wire out of the new high temperature superconductors. In many applications a composite multi-filamentary wire will be required. Such wire cannot be made by drawing rods into filaments because of the extreme brittleness of the new materials.

Accordingly, there is a continuing need for alternative methods of making filaments of the high temperature superconductors of Bismuth such as these here described. This invention has as its primary objective the fulfilling of this need.

The conditions under which the ceramic is prepared affect the superconductivity. This is important because the fibers as initially prepared are not superconducting and must be made superconducting with a heat treatment. This invention is particularly useful in making Bi(2212) and lead doped varients thereof, but may also be applied to Bi(2223).

A primary objective of this invention is to use the pendant drop melt extraction technique to produce superconductor fibers in a manner in which the superconductivity is not permanently destroyed by the process of pendant drop melt extraction. This has heretofore not been achievable, primarily because the conditions normally utilized for pendant drop melt extraction affect ceramic as well as the formation of new phases and may destroy superconductivity. In this process superconducting can be restored after pendant drop melt extraction by a simple heat treatment.

SUMMARY OF THE INVENTION

In accordance with this invention, a Barium strontium calcium copper oxide ceramic feedstock is melted with a hydrogen-oxygen torch and lowered onto the edge of a spinning wheel. The wheel has a large temperature differential from the liquid ceramic, and as a result fibers of up to 10 cm in length are produced by freezing onto the wheel. Usually the lateral dimensions of the fibers range from 20 $\mu$m to 30 $\mu$m. The fibers thereafter are heat treated to make them superconducting.

DETAILED DESCRIPTION OF THE INVENTION

Pendant drop melt extraction is a known technique for forming fibers, and it was developed in the 1970's as an alternative to drawing through a dye, R.E. Maringer and C.E. Mobley, *J. Vac. Sci. Technol.* 11 (1974) 1067. However, pendant drop melt extraction does subject the ceramic to a variety of hot-cold conditions and has therefore not to this time been necessarily considered useful for forming fibers of superconductor ceramics such as Bi(2212) and Bi(2213) and lead doped varients thereof.

A key to the present process is contacting the melted ceramic drops with a cool spinning wheel rotating at carefully controlled linear speeds, followed by a heat treatment of the fibers within a defined temperature range in an oxygen environment to allow ceramic crystals to form within the extracted fibers, followed by slow cooling in an oxygen environment. When this is done, superconducting fibers up to 10 cm long have been produced.

The initial starting feedstock, that is the superconductive metal oxide ceramic of Bismuth in an amorphous state may be obtained from many widely available sources. In accordance with the first process step, the ceramic is heated to a temperature above its melting point, i.e. above 890° C. The most effective heating is done with a rod of the ceramic with the tip of the rod melted at its bottom end with a hydrogen-oxygen torch, or with another heating device. This forms a liquid drop. When it is evident that a liquid drop of the ceramic has formed, it is then lowered onto the edge of a spinning brass wheel which typically has a 3" diameter and an angle of 90° at the knife edge.

The wheel is typically spinning at a speed at the wheel edge of from about 230 rpm to about 430 rpm, preferably from about 230 rpm to about 300 rpm. The temperature of the spinning wheel is not critical, but commonly may be about 200° C. As a result, the liquid freezes on the edges of the spinning wheel, and as the wheel spins a filament is formed. As the wheel spins, the filament cools, contracts, and is thrown off the wheel and collected. If desired the wheel may be notched to control fiber length.

The fibers which form on the spinning wheel tend to be more uniform in both length and thickness toward the lower end of the linear speed range for the spinning wheel.

These fibers, once formed, on most occasions have a circular cross-section and appear quite uniform. The fibers produced at rates of rotation in the lower range vary in length from about 2 cm to about 4 cm, although they may be as long as 15 cm and they vary in diameter from about 20 micrometers to about 30 micrometers. At higher rates of rotation the fibers are thicker and less uniform in cross-section. The fibers, as spun, before heat treatment are flexible; they can be bent through an angle of 90° without breaking. By notching the wheel, fibers of uniform length of about 4 cm can be produced.

The fibers are not superconducting at this point. It has been found necessary and it is a critical part of this invention to heat treat the fibers in flowing oxygen or air to allow the phases present to react and reform superconductors. Heat treating of the fibers may be at a temperature within the range of from about 820° C. to about 870° C. in air or an oxygen enriched environment for from about 16 hours to about 24 hours. This can be done in a ceramic furnace which is continually flushed with either air or oxygen.

Following the heat treatment, fibers are then slowly cooled to a temperature of at least as low as 200° C. This slow cool can occur for from about 9 hours to about 16 hours. A slow cool may even last up to 24 hours.

When this process is performed the resulting fibers will exhibit large intragranular critical current densities at low temperatures, but also low transport critical current densities. The resulting fibers are quite brittle. For end use, those fibers may thereafter be coated with silver and embedded in a copper matrix or other highly conducting matrix material. These fibers typically have a Tc of approximately 85 K.

EXAMPLE

A rod of Bi(2212) was pendant drop melt extracted in the following manner. The tip of the rod was heated with a hydrogen-oxygen torch to form a liquid drop. The drop was lowered onto the edge of a spinning brass wheel having a 3" diameter and an angle of 90° at the knife edge. The wheel was at approximately 200° C. The liquid froze on the edge of the wheel. The wheel was rotating at linear speed at the wheel edge of about 230 rpm. As the filament cooled it contracted and was thrown off of the wheel and collected. The fibers ranged in length from 2 cm to 4 cm.

Magnetization measurements with a Quantum Design magnetometer showed that the as-spun fibers were not superconducting. X-ray diffraction on the as-spun fibers showed no Bi(2212) lines; rather, the sample was composed of amorphous ceramic material.

Heat treating the fibers in flowing air allows the phases present to react and re-form Bi(2212). In a typical fiber, heat treated in air at 850° C. for 16 hours then slowly cooled to 200° C. in 9 hours, magnetization measurements showed a sharp transition at 85 K. Superconductivity was checked for and confirmed by means of magnetization measurements.

This method, although described with regard to Bi(2212) may also be applied to Bi(2223), and the Pb-doped Bi-Sr-Ca-Cu-O superconductors, and the Tl-Ba-Ca-Cu-O superconductors.

After heat treatment to make the fibers superconducting, the fibers exhibit large intragranular critical current densities at low temperature, but low transport critical current densities. These fibers are ready for textured growth in a steep temperature gradient for the next step in fiber development.

It therefore can be seen that the invention accomplishes at least all of its stated objectives.

What is claimed is:

1. A method of pendant drop melt extraction forming of superconductive fibers of Bismuth (2212) or (2223) compounds, comprising:
   (a) heating to a temperature above the melting point of Bi(2212) or (2223) compounds, a superconductive ceramic;
   (b) contacting said drops with an edge of a cool wheel rotating at a speed of from about 230 rpms to about 430 rpms, which results in formation of fibers from said liquid drops on said wheel;
   (c) heat treating said fibers at a temperature at from about 820° C. to about 870° C. in air from about 16 hours to about 24 hours to allow crystals of Bismuth ceramic to form within said fibers; and
   (d) slowly cooling said fibers in to a temperature of at least 200° C.

2. The method of claim 1 wherein the heating is above 890° C.

3. The method of claim 1 wherein the speed of revolution is from about 230 rpm to about 300 rpm.

4. The method of claim 1 wherein the heating treatment of the fibers in step (c) is at a temperature of from about 820° C. to about 850° C.

5. The method of claim 1 wherein the slow cooling is to a temperature of at least 200° C. over a time of from about 9 hours to about 16 hours.

6. The method of claim 3 wherein the temperature of the cool wheel is from about 100° C. to about 300° C.

* * * * *

UNITED STATES PATENT AND TRADEMARK OFFICE
CERTIFICATE OF CORRECTION

PATENT NO. : 5,053,384

DATED : October 1, 1991

INVENTOR(S) : Schwartzkopf, et al

It is certified that error appears in the above-identified patent and that said Letters Patent is hereby corrected as shown below:

On the title page, Item [19] should be -- Schwartzkopf, et al
[75] Inventors: should be -- Louis A. Schwartzkopf, Michael W. Huck--, both of Mankato, Minn.

Signed and Sealed this

Twentieth Day of April, 1993

Attest:

MICHAEL K. KIRK

*Attesting Officer*

*Acting Commissioner of Patents and Trademarks*